(12) United States Patent
Schumacher

(10) Patent No.: US 10,827,634 B2
(45) Date of Patent: Nov. 3, 2020

(54) ELECTRONICS MODULE AND MOUNTING BASE

(71) Applicant: Weidmüller Interface GmbH & Co. KG, Detmold (DE)

(72) Inventor: Ralf Schumacher, Lemgo (DE)

(73) Assignee: Weidmüller Interface GmbH & Co. KG (DE)

( * ) Notice: Subject to any disclaimer, the term of this patent is extended or adjusted under 35 U.S.C. 154(b) by 0 days.

(21) Appl. No.: 16/473,523

(22) PCT Filed: Jan. 10, 2018

(86) PCT No.: PCT/EP2018/050520
§ 371 (c)(1),
(2) Date: Jun. 25, 2019

(87) PCT Pub. No.: WO2018/130547
PCT Pub. Date: Jul. 19, 2018

(65) Prior Publication Data
US 2019/0335597 A1    Oct. 31, 2019

(30) Foreign Application Priority Data

Jan. 13, 2017    (DE) .................... 20 2017 100 172 U

(51) Int. Cl.
*H05K 7/00*     (2006.01)
*H05K 5/02*     (2006.01)

(52) U.S. Cl.
CPC ......... *H05K 5/0234* (2013.01); *H05K 5/0204* (2013.01); *H05K 5/0221* (2013.01)

(58) Field of Classification Search
USPC .................... 361/728, 810; 439/94, 716, 717
See application file for complete search history.

(56) References Cited

U.S. PATENT DOCUMENTS

| | | | |
|---|---|---|---|
| 3,160,280 A | 12/1964 | Burch | |
| 5,775,955 A * | 7/1998 | Graube | H01R 9/2658 439/717 |
| 7,609,528 B2 | 10/2009 | Freimuth et al. | |
| 2006/0249507 A1 * | 11/2006 | Bohlinger | H05B 1/02 219/486 |
| 2009/0176388 A1 | 7/2009 | Wu et al. | |

FOREIGN PATENT DOCUMENTS

| | | |
|---|---|---|
| CN | 1739222 A | 2/2006 |
| DE | 2719194 A1 | 11/1978 |
| DE | 9411323 U1 | 11/1995 |
| DE | 10249981 B3 | 4/2004 |
| DE | 102015117427 A1 | 4/2017 |

* cited by examiner

*Primary Examiner* — Hung S. Bui
(74) *Attorney, Agent, or Firm* — Laubscher & Laubscher, P.C.

(57) ABSTRACT

An electronics module includes a housing having a mounting foot or component suitable for mounting on a support rail and for fastening the electronics module to the support rail which is mounted on a mounting base. At least one spring element is provided in the lower region of the housing facing the mounting base when mounted. The at least one spring element is configured to provide a damping effect when the housing vibrates relative to the mounting base.

14 Claims, 14 Drawing Sheets

`US 10,827,634 B2`

ELECTRONICS MODULE AND MOUNTING BASE

This application is a § 371 National Stage Entry of International Patent Application No. PCT/EP2018/050520 filed Jan. 10, 2018. Application No. PCT/EP2018/050520 claims priority of DE202017100172.5 filed Jan. 13, 2017. The entire content of these applications are incorporated herein by reference.

BACKGROUND OF THE INVENTION

The invention relates to an electronics module and an assembly including a mounting base having a support rail and a plurality of electronics modules.

Electronics modules of the class-specific type often are used in locations—for example, in control cabinets of machine tools or similar equipment—where they are exposed to severe vibrations and shocks.

The object underlying the invention is to design the electronics modules in such a manner that the risk of damage caused by such vibrations is reduced.

SUMMARY OF THE INVENTION

The electronics module according to the invention includes a housing having a mounting foot or component suitable for mounting on a support rail and for fastening the electronics module to the support rail which is mounted on a mounting base. At least one spring element is provided in the lower region of the housing, preferably at a distance from the mounting component and facing the mounting base when mounted. The spring element is configured to provide a damping effect when the housing vibrates relative to the mounting base. Thus, the risk of damages caused by shocks or vibrations is effectively reduced. It is advantageous if two or more of the spring elements are provided on the housing.

The spring elements can be realized simply and cost-effectively by integrating at least one or a plurality of the spring elements as part of a wall, in particular a sidewall, of the housing. Alternatively, the spring elements can be attached or injection-molded to the housing, for example in the form of an elastomer spring.

According to a preferred embodiment, the housing includes one or a plurality of spring elements in the region of its lower, outer corners which are formed on the side of the housing facing the mounting base in its mounted state.

Additionally, a plurality of sidewalls of the housing respectively include one or a plurality of the spring elements to achieve an elastic support distributed over a plurality of locations.

It is also advantageous in terms of a cost-effective and compact design if each spring element includes at least one spring arm or two or more spring arms, which protrude(s) downward from the housing at the side facing the mounting base.

The spring arms can be provided in a variety of configurations.

The invention further includes a mounting base having a support rail and having electronics modules arranged on the support rail adjacent to each other in a row.

BRIEF DESCRIPTION OF THE FIGURES

Other objects and advantages of the invention will become apparent from a study of the following specification when viewed in the light of the accompanying drawing, in which:

FIG. 6a is a front view of a known electronics module mounted on a mounting base and FIG. 6b is a partial detailed view of a corner of the module of FIG. 6a.

DETAILED DESCRIPTION

Figure 3A:
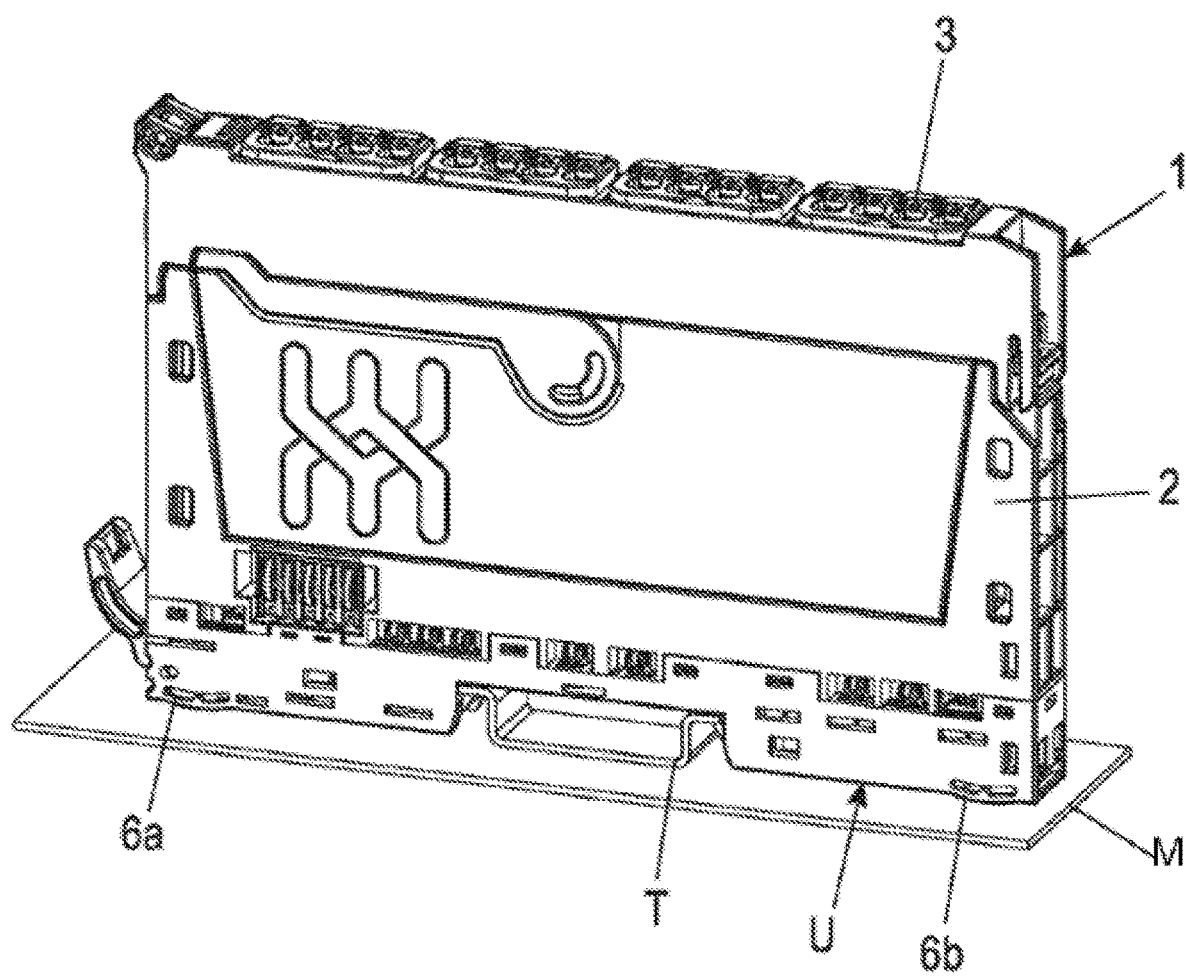
FIGS. 3a, 3b, and 3c are front perspective, front, and bottom perspective views, respectively, of a second embodiment of an electronics module of the assembly.
Figure 3B:
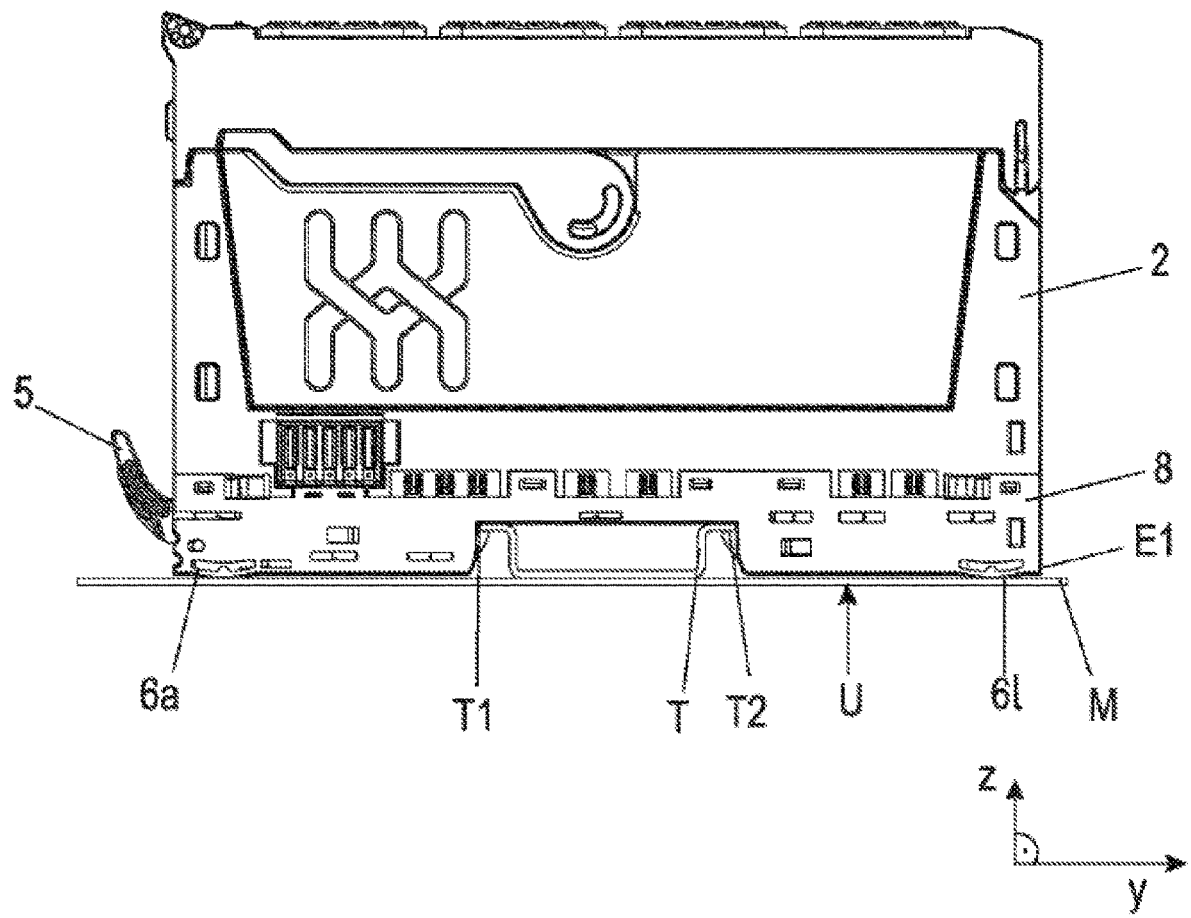

In the following, the basic design of a known electronics module according to FIG. 6 is initially described. Location information and terms such as "top" and "bottom," and "right" and "left," relate to a lower mounting base M in the horizontal orientation of FIG. 6 or also relate to the invention shown in FIG. 3b) and are to be understood to relate to each other in this way. When in use, the mounting base M may also be oriented vertically or at an angle.

The known electronics module 1 includes a housing 2 made from a plurality of components. This housing 2 preferably is formed of a non-conductive plastic. Inside the housing is arranged a functional electronic circuit having one or more electronic components. The electronic components may include one or a plurality of components such as resistors, capacitors, coils, diodes, etc., on the one hand, but also one or a plurality of purely current-conducting components such as bus bars, conductors, conductor connectors, etc. The functional electronic circuit therefore may be limited to one or a plurality of connectors 3a, 3b, 3c . . . and one or a plurality of bus bars, but may also include one or a plurality of additional electronic components, such as those listed above. Preferably, one or a plurality of connectors 3a, 3b, . . . for plug-in elements such as plugs or conductor ends are provided on the housing 2 which in this case are on the upper side.

At least one support rail T is provided on the mounting base M. This support rail T has a hat-shaped profile, although other configurations may be used.

The housing 2 is provided with a mounting foot or component 4 at its lower region which is oriented toward the support rail T. This housing 2 is mounted on the support rail T and is attached to the same by the mounting foot 4. The mounting foot 4 can be unlocked and locked by a handle 5 via a mechanism (not shown).

Figure 1A:
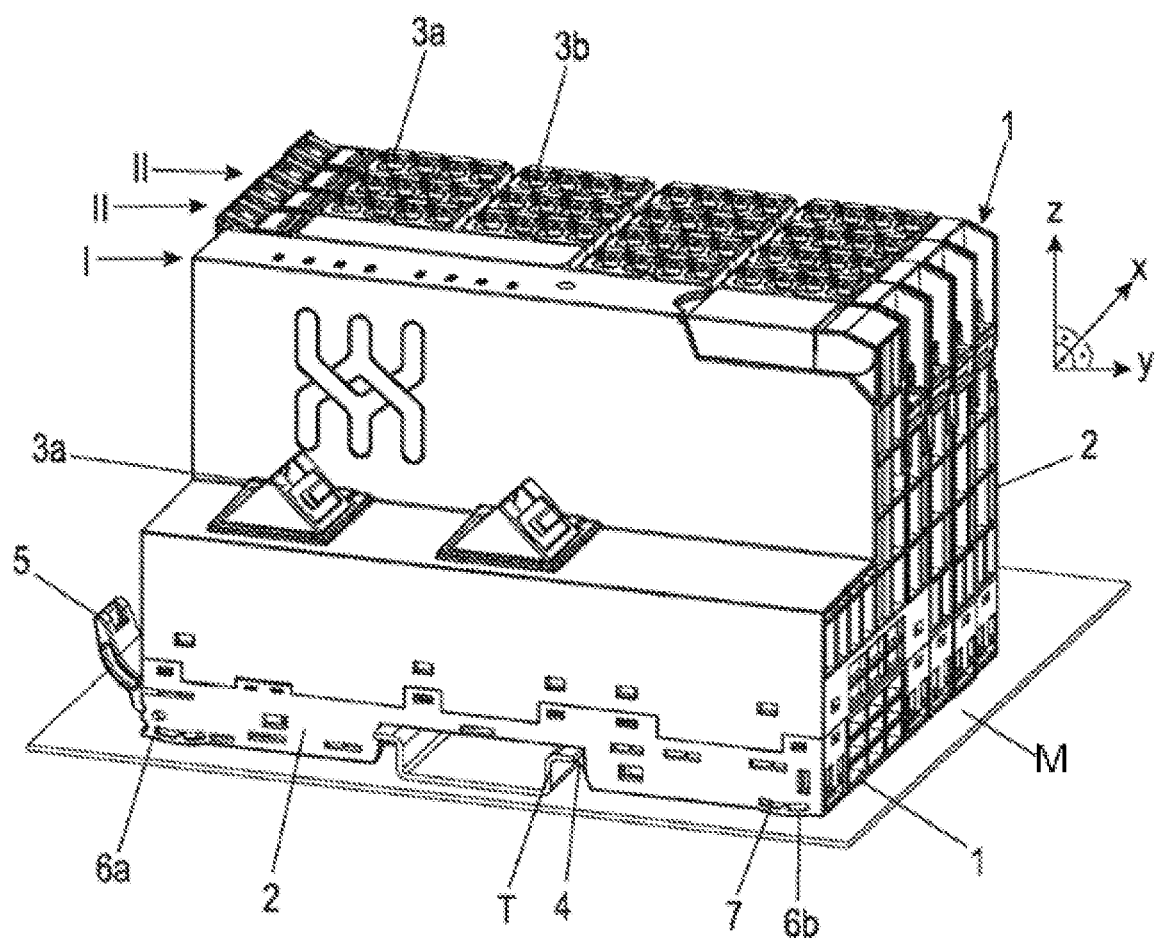
FIG. 1a is a front top perspective view of an assembly of electronics modules according to the invention adjacent to each other in a row and mounted on a mounting base and FIG. 1b is a bottom side perspective view of the assembly of FIG. 1a with the mounting base removed.

In the following, a Cartesian coordinate system X, Y, Z is used to explain the spatial orientation. The support rail T extends in the X direction as shown in FIG. 1. The mounting base M is located in the X/Y plane. The vertical direction perpendicular to the mounting plane is indicated with Z.

The housing 2 extends laterally beyond the respective edges T1 and T2 of the support rail T in the +Y direction and/or the −Y direction. For example, it extends beyond the edges T1, T2 of the support rail T by 50 to 150 mm in the Y direction and/or the −Y direction. The bottom side U of the housing 2—that is, the side U facing the mounting base M is arranged very close to the mounting base M. This means that the distance A (FIG. 6b) of the housing 2 in its mounted state relative to the level mounting base M is less than 10 mm below the support rail T, in particular less than 4 mm. If the lateral extension in the Y direction is relatively great, there is a risk of the housing 2 being placed into motion when the mounting base M and the support rail T are oscillating, causing the bottom side of the housing 2, in particular in the region of the corners E1 and E2, to strike the mounting base M. This in turn can lead to a serious risk of damaging the functional electronics and/or other functional elements of the electronics module 1.

The housings 2 preferably include connection elements and are designed to be mounted in a row. This means that several of the electronics modules 1 can be mounted in a row in the main direction of extension X of the support rail as shown in FIG. 1. For this purpose, the electronics modules 1 preferably have a relatively narrow, disc-shaped design. All of the modules can be designed in the same manner. However, it also is possible to provide electronic modules 1 of the different types I and II. These can be of various widths (in particular in the X direction) and can be of different designs in their upper regions facing away from the support rail. Thus, FIG. 1 shows an electronics module 1 of the first type I, which is designed as a field bus coupler. Mounted adjacent to it are electronics modules of a second type II, which are designed as I/O modules but which also could have a different functionality.

Figure 6A:
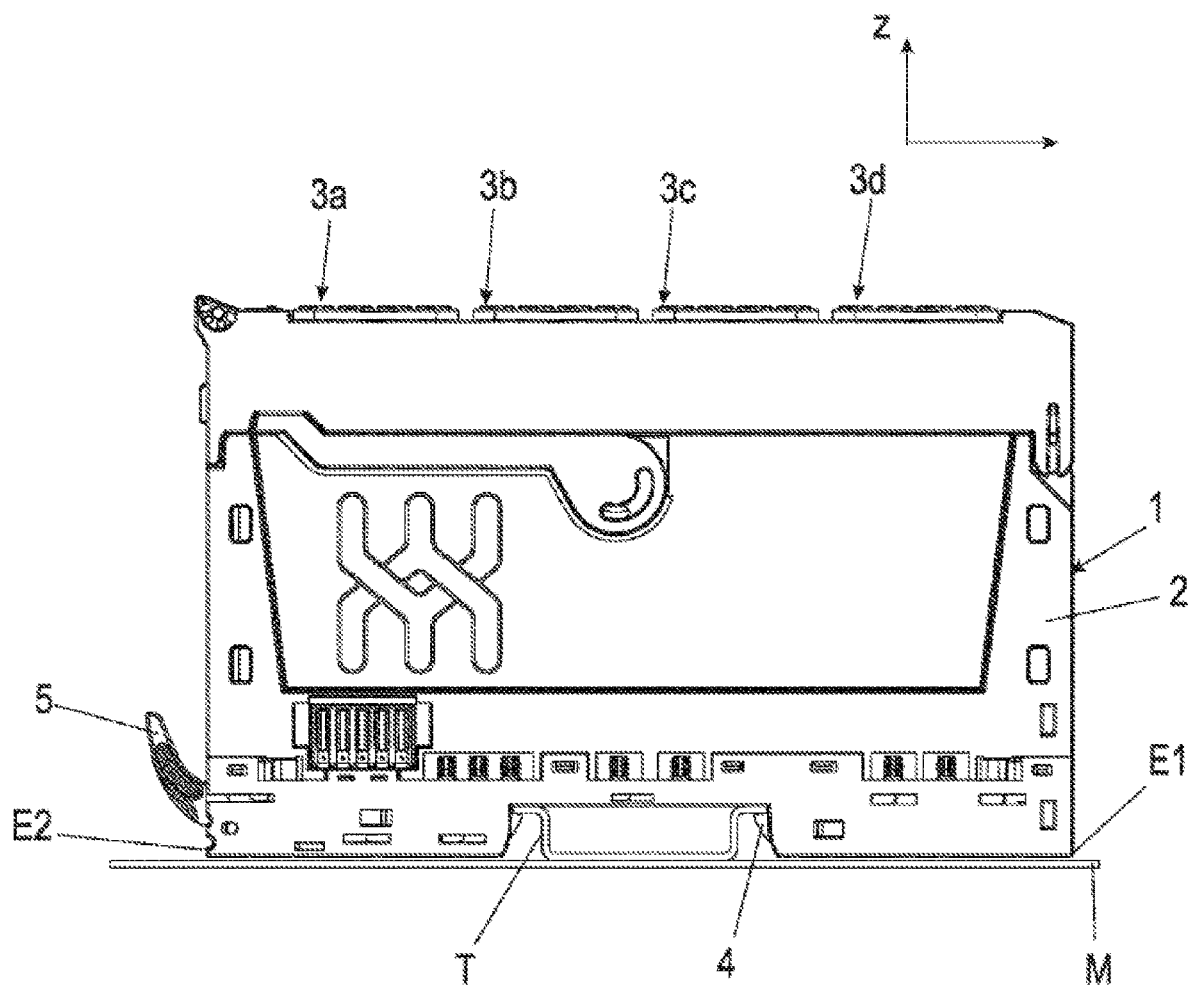
Figure 6B:
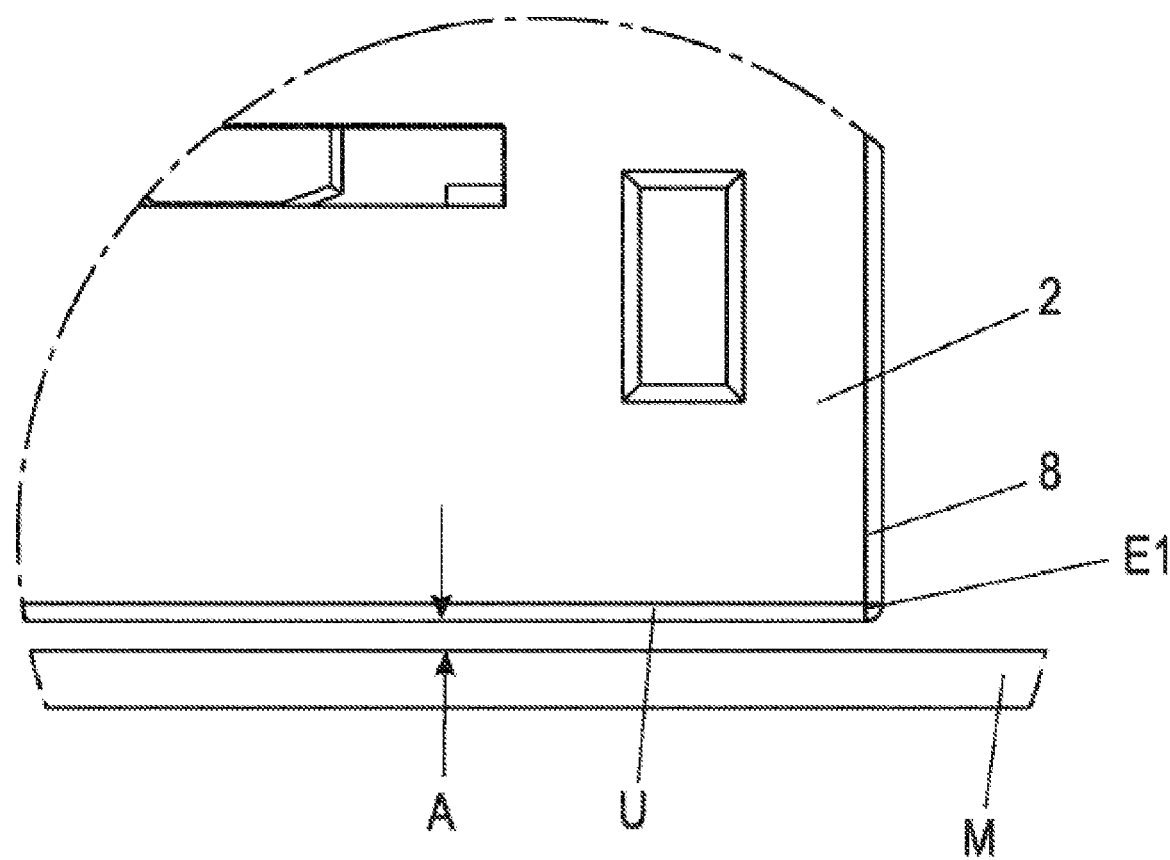

According to the invention and in contrast to the design shown in FIGS. 6a and 6b, at least one spring element 6 is provided in the lower region of the housing of each electronics module 1. Preferably, the spring element 6 is integrated into the housing 2 and is designed to be of one piece. This design is simple, cost-effective and functionally secure. According to another version, the at least one spring element can also be a separate spring element of the type of an elastomer or a metal or plastic spring (e.g., a type of leaf spring), which is attached on the bottom side of the housing (not shown).

Due to the low cost and the small installation space required, the version in which the spring element 6 is designed to be of one piece with the housing 2—that is, integrated with the same—is preferred.

In the following, each of the spring elements 6 is described individually. At least one or more of these spring elements 6 is/are mounted on an electronics module according to the invention. Particularly preferred is a design with four spring elements, of which two respective spring elements 6a and 6c, or respectively, 6b and 6d are designed in the area of the two lower corner regions E1 and E2, or close to these corner regions (on both sides of the support rail T, in this case on each side of the electronic module) on the bottom side U of the housing 2. The electronics module of the type II has eight of the spring elements. The electronics module of the type I preferably has four of spring elements 6.

According to FIG. 1, the corner regions are the regions which are most likely to strike the mounting base M. This, however, is not inherently the case, but results from the preferred design of the inventive housings shown here, in which the bottom sides of the housings 2 are essentially level on the side of the support rail T except for the spring elements 6. In the case of a stepped design of the bottom side of the housing 2, at least one of the spring elements 6 could be placed in a different location (not shown).

Each of the housings 2 shown in FIGS. 1 to 5 (and 6) has an essentially rectangular design in the side view shown in FIG. 1. This is advantageous but not mandatory. Each housing 2 has a bottom side U, which is orientated toward a mounting base M in its mounted state. This mounting base M is the wall of a control cabinet, for example. In the following description, this mounting base M is considered to be level.

The preferred spring element 6, 6a, 6b, . . . , which is designed in the respective corner regions E1 and E2 of the bottom side U of the housing 2, is formed in these locations by the housing 2 having at least one of the spring arms 7 in the area of each spring element 6. The spring arm 7 extends downward (in the direction of the mounting base M) like a protrusion beyond the adjacent lower edge of the bottom side U of the housing 2 in this area. The spring element(s) 6 with the spring arm 7 preferably is/are designed on one or both of the main sidewalls 8 and 9 of the housing 2, and are integrated with the same in a cost-effective manner and in a simple, integral design.

Figure 1B:
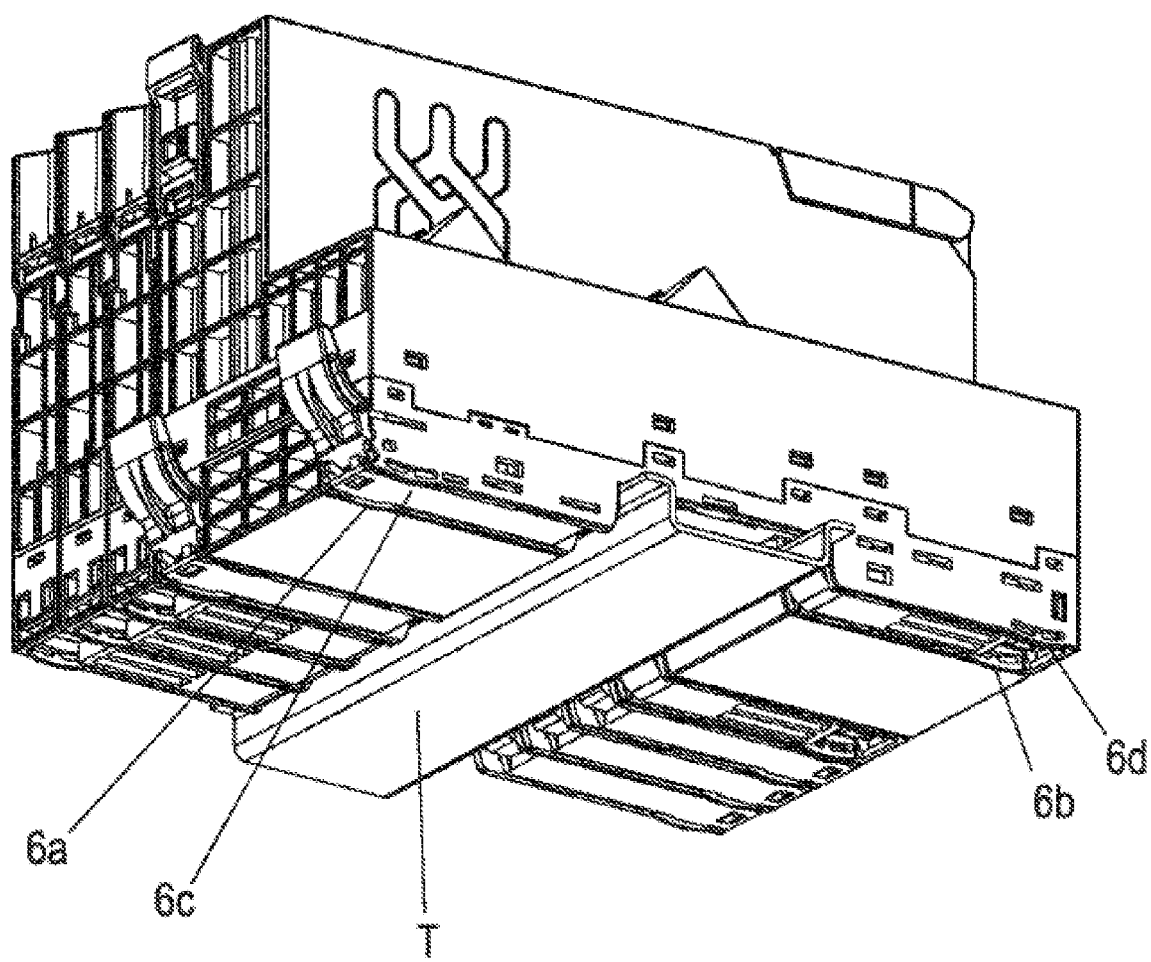
Figure 2A:
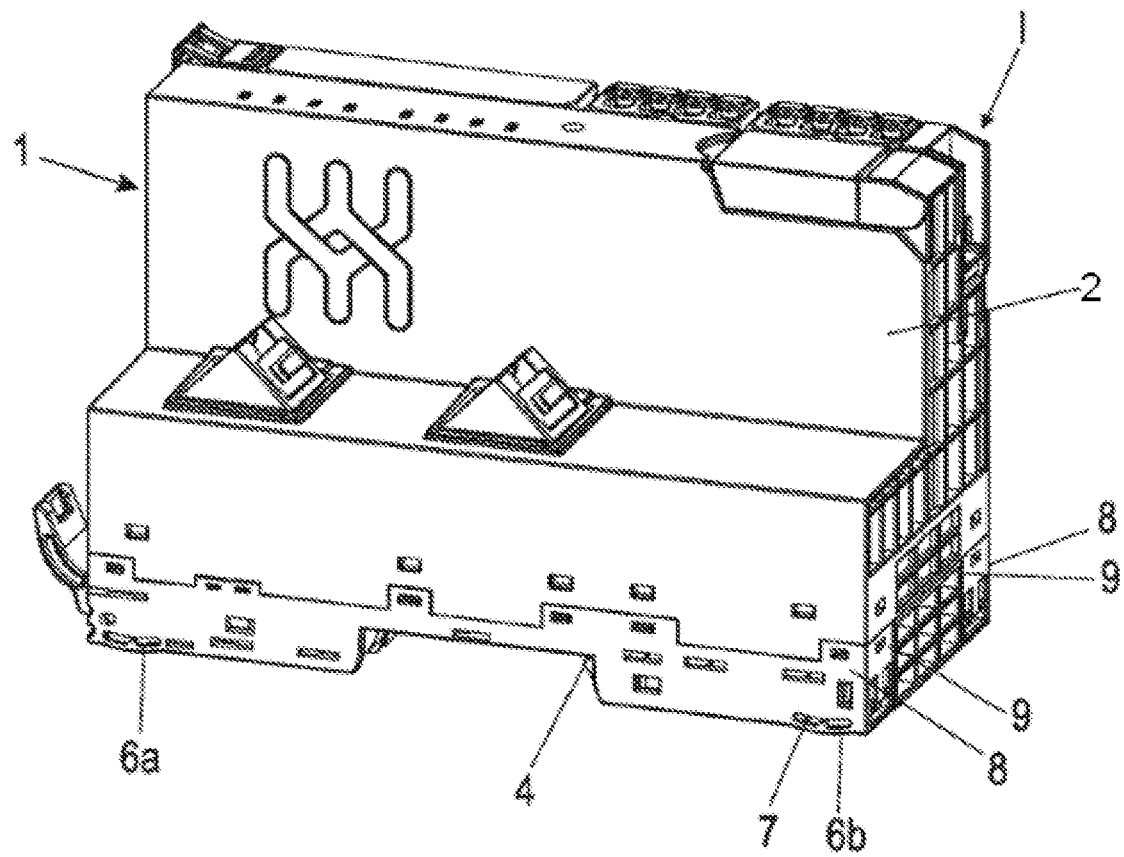
FIGS. 2a, 2b, and 2c are front perspective, front, and bottom perspective views, respectively, of a first embodiment of an electronics module of the assembly of FIG. 1 with the mounting base removed.
Figure 2B:
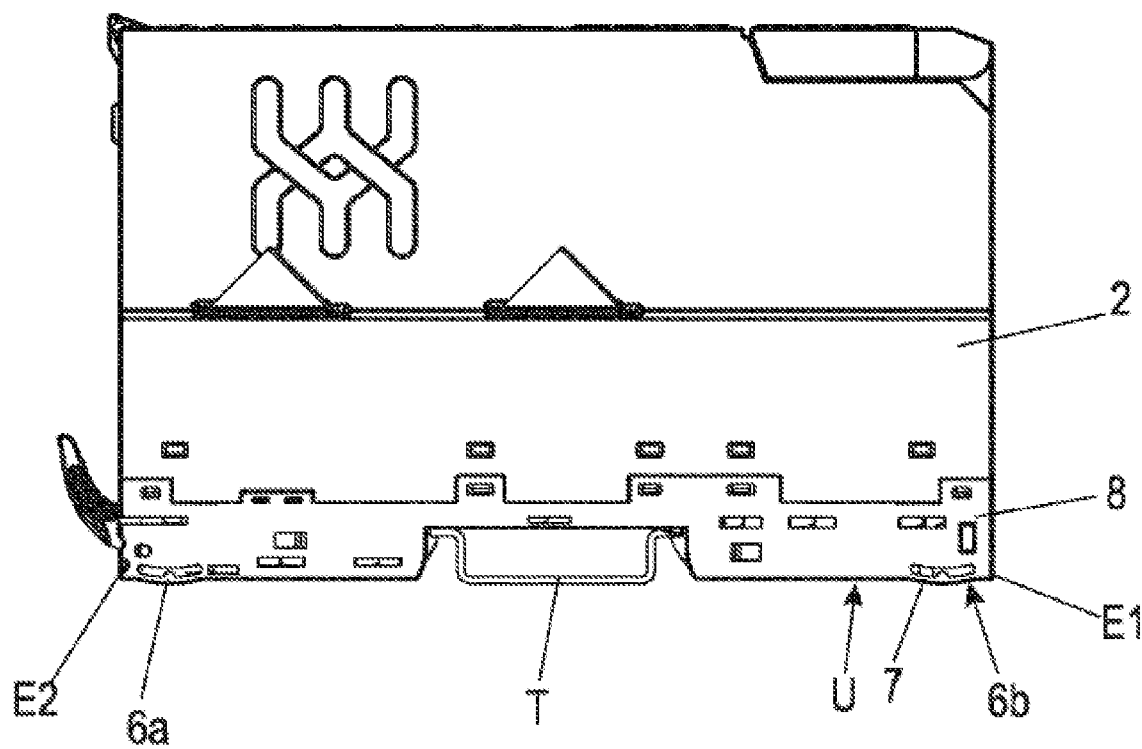
Figure 2C:
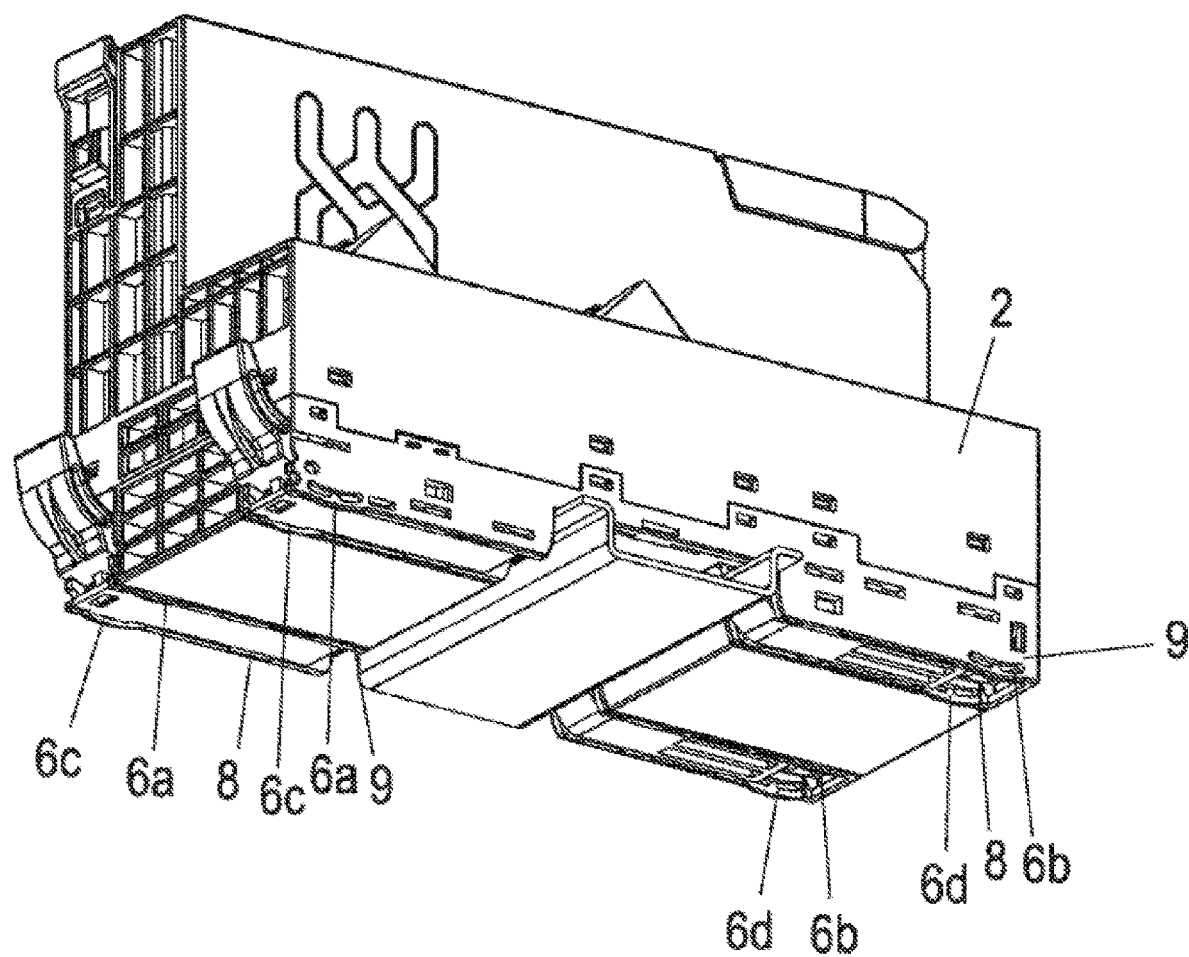
Figure 3C:
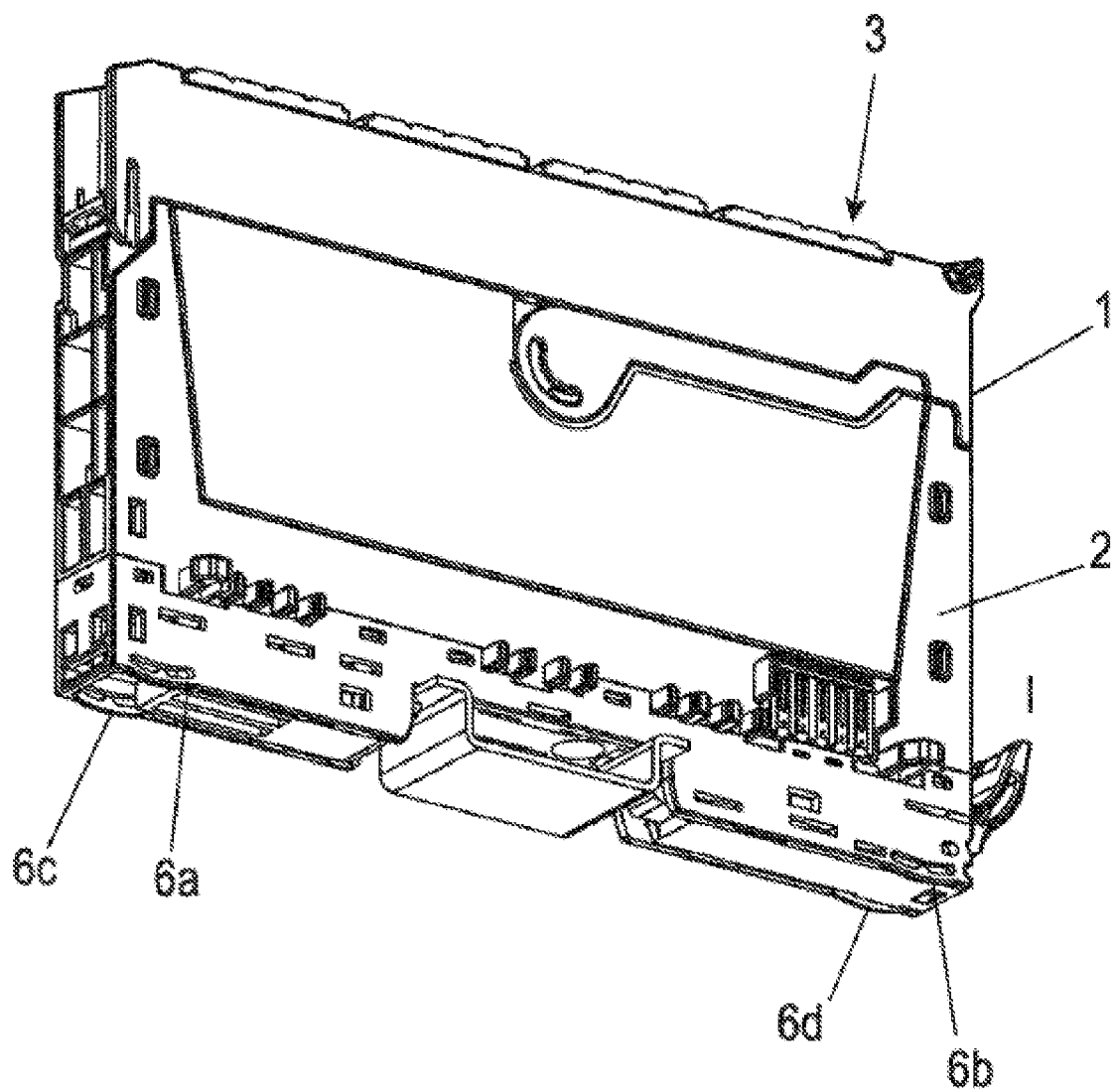

This is shown particularly in FIGS. 1b, 2c and 3c. The main sidewalls 8 and 9 are the walls of the housing 2 which attach to the next housing and which are positioned in the Y/Z plane. The spring arm 7 preferably is integrated into these sidewalls. It also is possible to include it in the lower wall or at the short sidewalls of the housing 2, which connect the main sidewalls 8 and 9.

An electronics module may have more than two of the sidewalls which are provided with one or more of the spring elements 6. This could be the case, for example, if the electronics module has a very great structural width, e.g., if it has a multiple grid width in the X direction, which is defined by the width of the electronics module of the second design type—reference number II. Thus, the electronic module of the first design—reference number I—has four sidewalls in the example—two outer main sidewalls and two partition walls which are positioned farther inward in the X direction—which, however, all are referred to as main sidewalls in the sense of this application and all of which are provided with spring elements 6 having one or more spring arm(s) 7 as shown in FIG. 1c.

It is possible that one or more of the spring elements 6 are designed in one or in both of the walls, in particular in the main sidewalls 8 and 9. Preferably, each of the two main sidewalls 8 and 9 is provided with two respective spring arms 7 near the lower, outer corners E1 and E2.

The spring arms 7 also can be connected with each other in the X direction by an arm (not shown). It also is conceivable that only three spring elements 6 are provided, such that two are positioned at the corners E1 and one at one of the corners E2 (not shown). Furthermore, conceivable designs for embodiments according to the invention, but slightly less preferred, could provide only one or two spring elements 6, such that one is positioned at one of the corners E1 and one at the respective corner E2 diagonally opposite from the former. Such a design would create an improved a safeguard against vibrations, which however can be further improved by additional spring elements 6. Finally, it also is conceivable that one of the spring elements 6 is integrated in the mounting foot 4 or a bottom wall (or is designed on the housing in another manner.

Figure 4A:
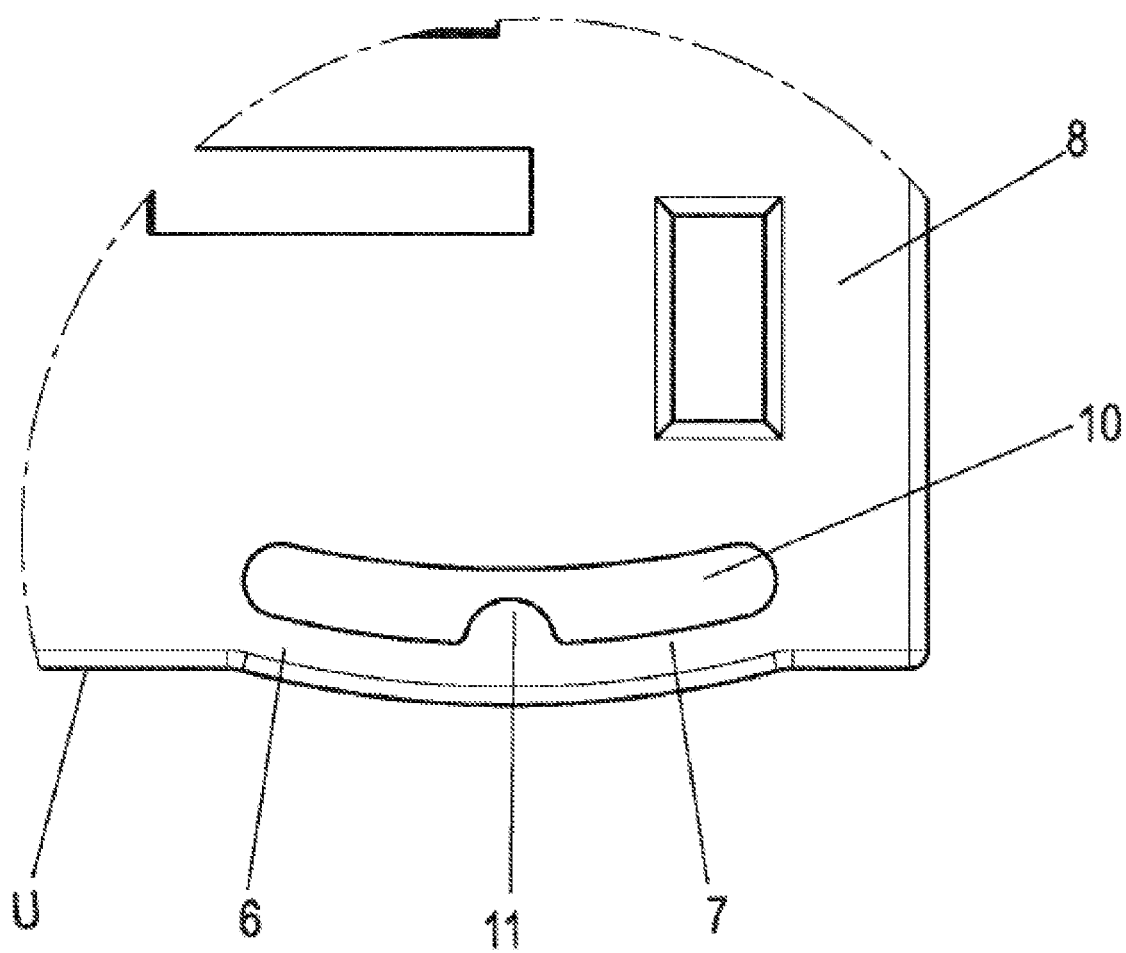
FIG. 4a is a detailed view of a corner region of an electronics module and FIG. 4b is a detailed view of a corner region of an electronics module mounted on the mounting base.

The at least one spring arm 7 is integrally attached to, or designed on, the housing 2, in particular the respective sidewall 8 or 9, at one or both ends (see FIGS. 4a and 5). Above the spring arm 7 is a window-like opening (which also can be a cutout) in the associated sidewall 9 of the housing 2. This opening can be formed as a slot 10, in particular as a curved slot. In this case, it is advantageous if the spring arm 7 also has a curved shape, wherein its middle region extends the farthest distance away from the adjacent lower edge of the housing 2, that is, its middle region is at the closest distance to the mounting base M as shown in FIGS. 1 to 4, 5a and 5b, 5a and 5d.

It is preferable—but not mandatory—for the opening to be formed as a narrow slot 10, which is only approximately 1 to 3 mm wide in the Z direction. If the housing 2 comes into contact with the mounting base M in the region of the respective spring arm 7 due to vibrations, the spring arm can be deflected into the opening, in particular into the slot. The spring arm 7 thereby dampens the shock. Thus, the entire electronics housing and in particular its functional electronics are effectively protected against damages from shocks.

Figure 4B:
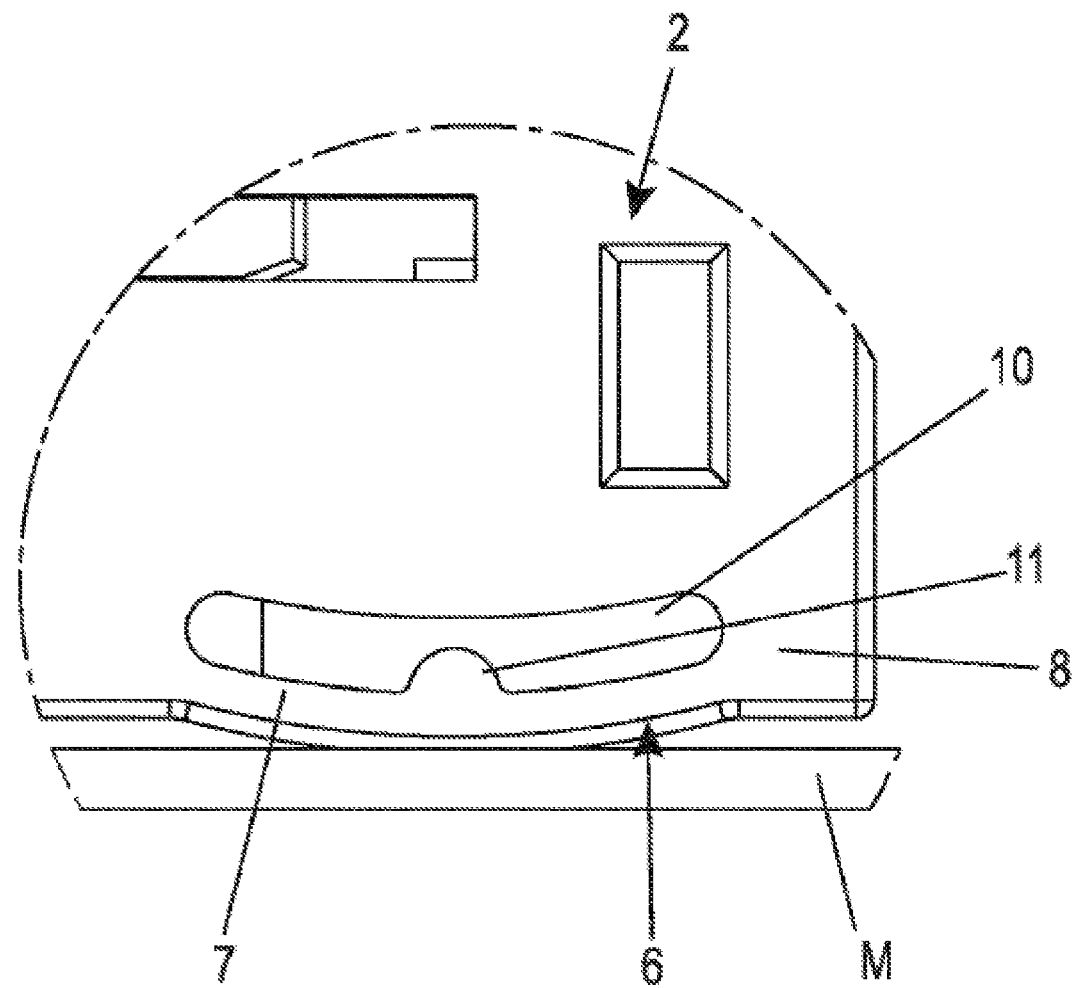

The spring arm 7 itself can, in turn, include a protrusion 11, which slightly protrudes from the upper edge of the spring arm 7 into the opening, in particular into the slot 10. This makes it easy to affect and adjust the spring characteristic. The spring arm 7 can also be at a distance to the mounting base at its lowest point and can only stop against the same in the case of shocks, or it can be supported on the same even in an idle position without the presence of shocks as shown in FIG. 4b.

Figure 5A:
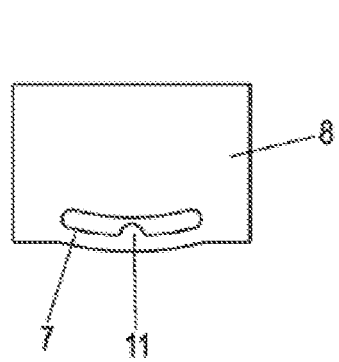
FIGS. 5a-5n are views of various lower corner regions for different embodiments of electronics modules according to the invention.
Figure 5B:
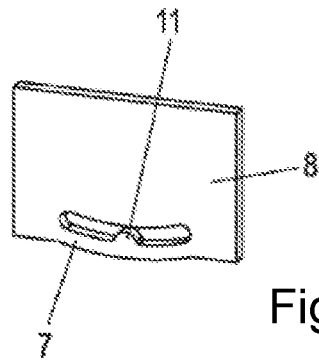
Figure 5C:
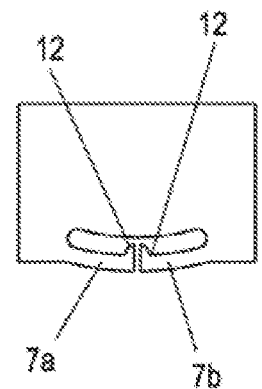
Figure 5D:
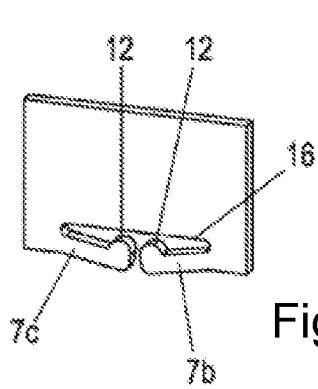
Figure 5E:
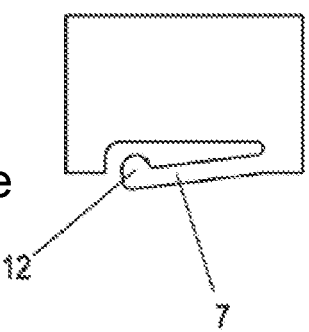
Figure 5F:
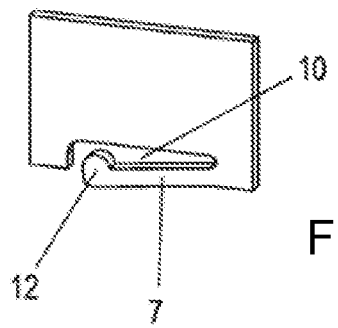
Figure 5G:
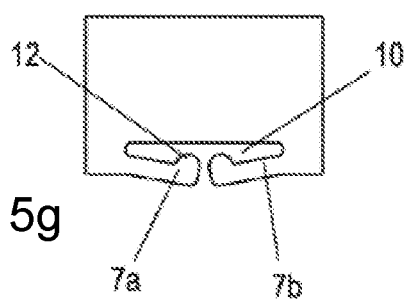
Figure 5H:
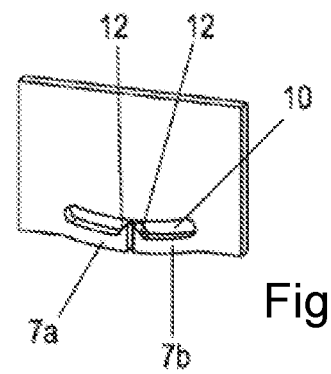
Figure 5I:
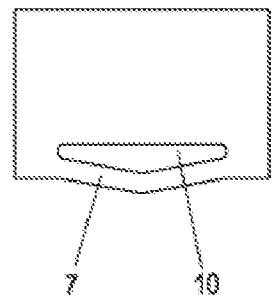
Figure 5J:
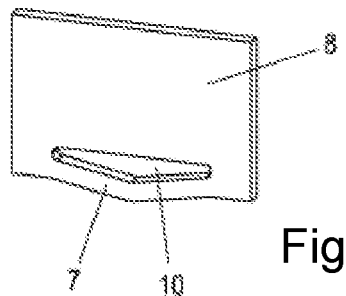
Figure 5K:
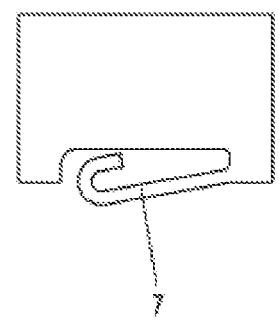
Figure 5L:
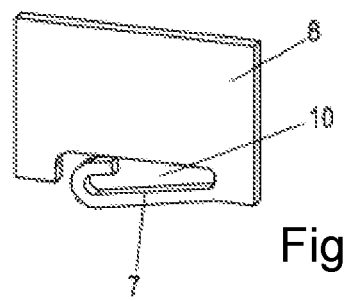
Figure 5M:
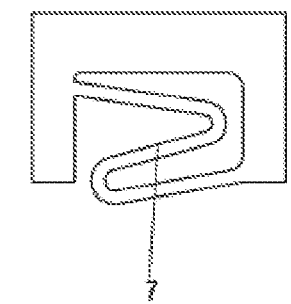
Figure 5N:
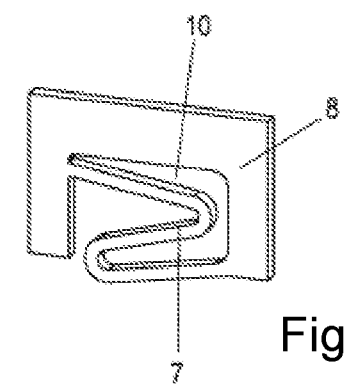

FIGS. 5a-5n show spring elements 6 of various designs. In each case, it only shows a lower corner section with a sidewall 8 or 9 of a housing 2 with one of the respective spring elements 6.

The respective spring element 6 can include a single spring arm 7 (FIGS. 5a and b, e and f, i and j, k and l, m and n) or two spring arms 7a and 7b (FIGS. 5c and d, g and h) or more than two spring arms.

Therein, each of the spring arms 7, 7a or 7b can be attached to the sidewall 8 at only one of its ends (FIGS. 5c and d, e and f, g and h, k and l, m and n) or at two ends (FIGS. 5a and b, i and j).

The opening 10 also can be designed in various manners. It can have a curved shape (FIGS. 5a and b, c and d) or another shape which allows the deflection of one or more spring arms 7a and 7b, such as a triangular shape (FIGS. 5i and j).

In cases in which the spring arms 7a, 7b, . . . are only attached to the associated sidewall 8 or 9 with one of their ends, it is advantageous for them to have a kind of hammerhead 12 as a protrusion 11 at the end, which extends into the opening and which limits the spring travel and affects the spring characteristic (FIGS. 5c and d, e and f, g and h, k and l). The hammerhead can be of a solid design or be designed as an arc (FIGS. 5k and l) or a hook.

The spring arm 7a, 7b, . . . also can be designed as a straight arm (FIGS. 5e and f, k and l)—except for the hammerhead, if provided—or can be designed as an angled arm (FIGS. 5i and j, m and n).

The invention claimed is:

1. An electronics module, comprising
(a) a housing having a mounting component for mounting on a support rail of a mounting base and fastening the electronics module to the support rail;
(b) at least one spring element integral with at least one side wall of said housing and arranged in a lower region of said housing, said lower region facing the mounting base when mounted, said at least one spring element including at least one spring arm which protrudes downwardly from said housing, said at least one spring element being configured to provide a damping effect when said housing vibrates relative to the mounting base.

2. The electronics module as defined in claim 1, wherein at least two spring elements are arranged on the housing.

3. The electronics module as defined in claim 1, wherein said at least one spring element is arranged at a distance from said mounting component of said housing.

4. The electronics module as defined in claim 1, wherein said at least one spring element is arranged in a region of lower, outer corners which are formed on a side of said housing facing the mounting base.

5. The electronics module as defined in claim 1, wherein said at least one spring arm is configured and arranged for support on the mounting base.

6. The electronics module as defined in claim 1, wherein said at least one spring element includes two or more spring arms.

7. The electronics module as defined in claim 1, wherein said at least one spring arm is integral with a main sidewall of said housing which faces in the direction of an adjacent housing to be mounted on the support rail.

8. The electronics module as defined in claim 1, wherein said at least one spring element having at least one spring arm is provided on each of two main sidewalls of said housing which face in the direction of an adjacent housing to be mounted on the support rail.

9. The electronics module as defined in claim 1, wherein said housing sidewall contains an opening above a respective spring arm, said opening being positioned such that the respective spring arm can be deflected into the area of said opening.

10. The electronics module as defined in claim 9, wherein said opening is configured as one of a curved or triangular slot positioned such that the respective spring arm can be deflected into an area of said slot.

11. The electronics module as defined in claim 9, wherein said at least one spring arm includes a protrusion which protrudes from an upper edge of said spring arm into said slot.

12. The electronics module as defined in claim 11, wherein said protrusion comprises a hammerhead.

13. The electronics module as defined in claim 1, wherein said spring arm has one of a curved, straight or angled configuration.

14. An electronics module assembly, comprising
(a) a mounting base
(b) a support rail connected with said mounting base;
(c) a housing having a mounting component mounted on said support rail to fasten said electronics module to said support rail; and
(d) at least one spring element integral with at least one side wall of said housing and arranged in a lower region of said housing, said lower region facing said mounting base when mounted, said at least one spring element including at least one spring arm which protrudes downwardly from said housing, said at least one spring element being configured to provide a damping effect when said housing vibrates relative to the mounting base.

* * * * *